(12) United States Patent
Quint et al.

(10) Patent No.: US 7,212,960 B2
(45) Date of Patent: May 1, 2007

(54) COMPUTER PROGRAM PRODUCT AND METHOD OF SIMULATING CIRCUITS USING A BALANCED, LOSSY, TRANSMISSION LINE CIRCUIT MODEL

(75) Inventors: David W. Quint, Fort Collins, CO (US); Karl Joseph Bois, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 764 days.

(21) Appl. No.: 10/365,808

(22) Filed: Feb. 13, 2003

(65) Prior Publication Data
US 2004/0162711 A1     Aug. 19, 2004

(51) Int. Cl.
*G06F 17/50*     (2006.01)

(52) U.S. Cl. .................................... 703/14; 333/117

(58) Field of Classification Search .............. 703/14
See application file for complete search history.

(56) References Cited

U.S. PATENT DOCUMENTS 5,063,595 A * 11/1991 Ballance ................ 370/522
6,334,219 B1 * 12/2001 Hill et al. ................ 725/106

OTHER PUBLICATIONS

Poon, "Computer Circuits Electrical Design", Prentice Hall, 1995, pp. 1-2, 23-25, 49,110, 123-151, 335-338,354-358.*
Yen et al "Time Domain Skin-Effect Model for Transient Analysis of Lossy Transmission Lines", Proceedings of the ITTT, vol. 70, No. 7, Jul. 1982.*
He et al "A Causal Skin-Effect Model of Microstrip Lines", IEEE MTT-S Digest, 1993.*
Jong et al ("Time-Domain Characterization of Interconnect Discontinuities in High-Speed Circuits", IEEE Transactions on Components, Hybrids and Manufacturing Technology, vol. 15, No. 4, Aug. 1992.*
Dhaene et al ("Selection of Lumped Element Models for Coupled Lossy Transmission Lines", IEEE Transactions on Computer-Aided Design, vol. 11, No. 7, Jul. 1992.*

* cited by examiner

*Primary Examiner*—Paul Rodriguez
*Assistant Examiner*—Mary C Jacob

(57) ABSTRACT

A computer program product and method of simulation involve the present computer simulation model of a lossy transmission line. The model uses a hybrid model at each end of the transmission line, each hybrid model coupled to a port of the transmission line. Each hybrid model is coupled to a forward path model and a reverse path model, such that simulated signals pass through the forward path mode enroute from a first hybrid to the second hybrid, and through the reverse path model enroute from the second hybrid to the first hybrid. At each end of the transmission line there is also a reflection model coupling between the reverse path model and the forward path model.

17 Claims, 2 Drawing Sheets

COMPUTER PROGRAM PRODUCT AND METHOD OF SIMULATING CIRCUITS USING A BALANCED, LOSSY, TRANSMISSION LINE CIRCUIT MODEL

FIELD OF THE DISCLOSURE

The present disclosure relates to the field of simulation of analog circuits on digital computers. In particular, a new model is disclosed of particular utility for simulating lossy transmission lines using conventional circuit simulators.

BACKGROUND

Since the introduction of Berkeley Spice in the early 1970's, circuit simulation has become an invaluable tool in the design of analog and digital circuits. It is common for modern designers to use circuit simulators not only to test designs before constructing them, but to optimize many circuit parameters. Spice is capable of DC, AC, and transient simulations of a wide variety of circuits. Many circuit simulators available today trace many of their features, including syntax and capabilities, to Spice, and several use algorithms derived from those of Spice. Common analog circuit simulators include Hspice, Pspice, and other Berkeley-Spice derivatives including Hpspice, Powerspice Ispice, Eldo, Ispec, Mtime, and Spectre.

Over recent decades, simulation models for active devices like transistors have become quite accurate and efficient even for the high-speed, small geometry, devices found in modem integrated circuits. Simulation models for ideal passive devices like resistors and capacitors are also efficient and accurate.

Real world circuits contain circuitry beyond active devices and ideal passive devices. Real circuits have internal and external interconnect that can be considered lossy transmission lines. Real transmission lines are typically lossy due to conductor resistances, including skin effect resistance, and dielectric losses. Transmission lines also have delay, and frequency-dependent reflections may arise because of impedance mismatches at ends of the transmission line. Accurate modeling and simulation of delay and reflections can be of great importance to circuit and system designers.

In the early days of integrated circuits, designers were able to ignore the lossy transmission line characteristics of internal interconnect. As circuit speed increased in recent years, it has become necessary to consider transmission line effects that historically were ignored.

It is therefore necessary to have a fast, efficient, accurate, lossy transmission line simulation model for circuit simulation of circuitry containing lossy transmission lines. It is also desirable that the simulation model function for DC, AC and transient simulations.

Some circuit simulators incorporate proprietary transmission line models. For example, the Hspice W element uses a set of proprietary algorithms for modeling transmission lines. The Hspice W element description of the transmission line characteristics is prepared in terms of frequency, the analysis by Spice during AC analysis is done in the frequency domain. This model does not readily transfer to the time domain, forcing use of a completely different algorithm for transient simulations. The Hspice W element therefore executes AC and transient simulations with separate algorithms. It is known in the industry that the W-Element had significant errors in the time domain algorithm for several years after its introduction. The Hspice W element transmission line is not found on most other simulators, circuit simulations that use them are not portable to those simulators.

It is desirable to model lossy transmission lines in a simple, fast, efficient, portable, and accurate way. To ensure portability, it is desirable that a transmission-line model be built from those circuit elements commonly found in Spice, Spice-derived, and Spice-like analog circuit simulators. It is also desirable that the model be implemented in Spice components that can be executed without alteration in AC and transient analysis.

Spice, Spice-like, and Spice-derived circuit simulators generally use the first character of each line of source to determine a component type. They provide primitives for the following component types:

| First Character | Component Type |
| --- | --- |
| R | Resistor |
| C | Capacitor |
| L | Inductor |
| E | Voltage Dependent Voltage Source |
| T | Ideal (lossless) Transmission Line |
| X | Subcircuit invocation |
| V | Voltage source |
| G | Voltage Dependent Current Source |
| H | Current Dependent Voltage Source |

While Spice provides an integral transmission line model, this typically models an ideal, lossless, transmission line as opposed to a lossy transmission line.

A commonly used circuit model for lossy transmission lines is an R-L-C ladder. The R-L-C ladder model uses cells containing a resistor, an inductor, and a capacitor. For balanced transmission lines, each cell contains two resistors, two inductors, and a capacitor. The cell is repeated multiple times, repetition increases accuracy of the model. While an R-L-C ladder model can provide portability and, if sufficient cells are used, reasonable accuracy, it has drawbacks at higher frequencies. Lossy transmission lines have a complex frequency dependence which can be difficult to model with fixed, discrete elements. For good accuracy, each frequency dependent resistor in FIG. 1 may need to be modeled using as many as 30 elements. High frequencies demand many R-L-C sections for accuracy, so the component count of the model can become quite large. The geometry of the model can also generate an ill-conditioned matrix which can cause severe round-off errors in the Spice engine. Round-off errors are undesirable because, the Spice simulation loses accuracy and may fail to converge. Failure to converge causes simulation to cease, and data is lost beyond this point in the analysis. What is needed is a new approach to the modeling of lossy transmission lines that does not require a large number of elements, can be used for transient and frequency analysis, and can accommodate variable lengths and frequencies without requiring large numbers of elements.

SUMMARY

A transmission line circuit simulation model is disclosed that utilizes hybrids at each end, with separate forward and reverse paths. In one embodiment, each of the forward and reverse paths includes sections for modeling loss, including frequency-dependent loss, and delay. In one embodiment, a balanced transmission line is modeled. In another embodiment, an unbalanced transmission line is modeled.

DETAILED DESCRIPTION OF THE EMBODIMENTS

Figure 1:
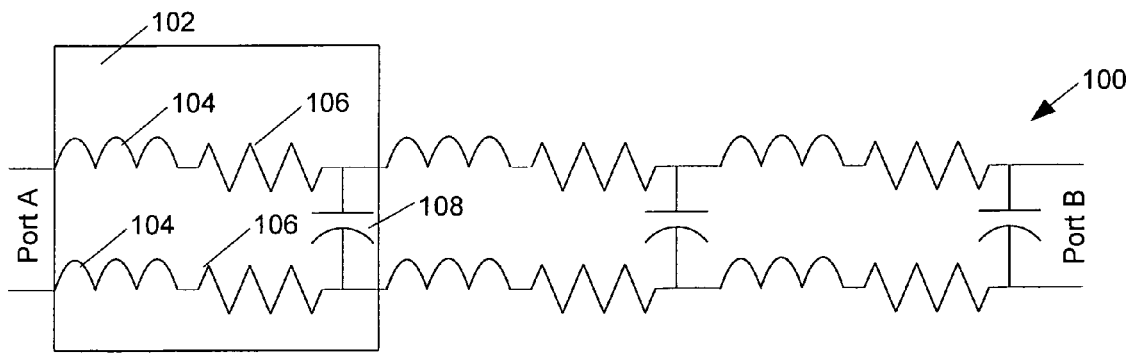
FIG. 1 is a schematic diagram of a conventional R-L-C model of a transmission line.

FIG. 1 illustrates a conventional R-L-C model of a transmission line 100. This model is assembled from a repeating unit 102 containing inductors 104, resistors 106, and capacitors 108. While only three repeating units 102 are illustrated, practical models may require many times this number. In this model, resistors 106 provide loss. Additional resistors, capacitors, and inductors (not shown) may be necessary to properly model frequency-dependent components of loss such as skin-effect loss; for example each resistor 106 may need to be modeled with a large number of resistor and inductor models connected in series-parallel.

Most Spice, Spice-like, and Spice-derived simulators available today allow use of node names in place of node numbers, node numbers are retained in the example code for utmost portability. Further, node 0 is ground, as it is in standard Berkeley Spice and derivatives such as Synopsys HSpice. The reader is referred to any standard text on Spice for a description of Spice syntax.

Figure 2:
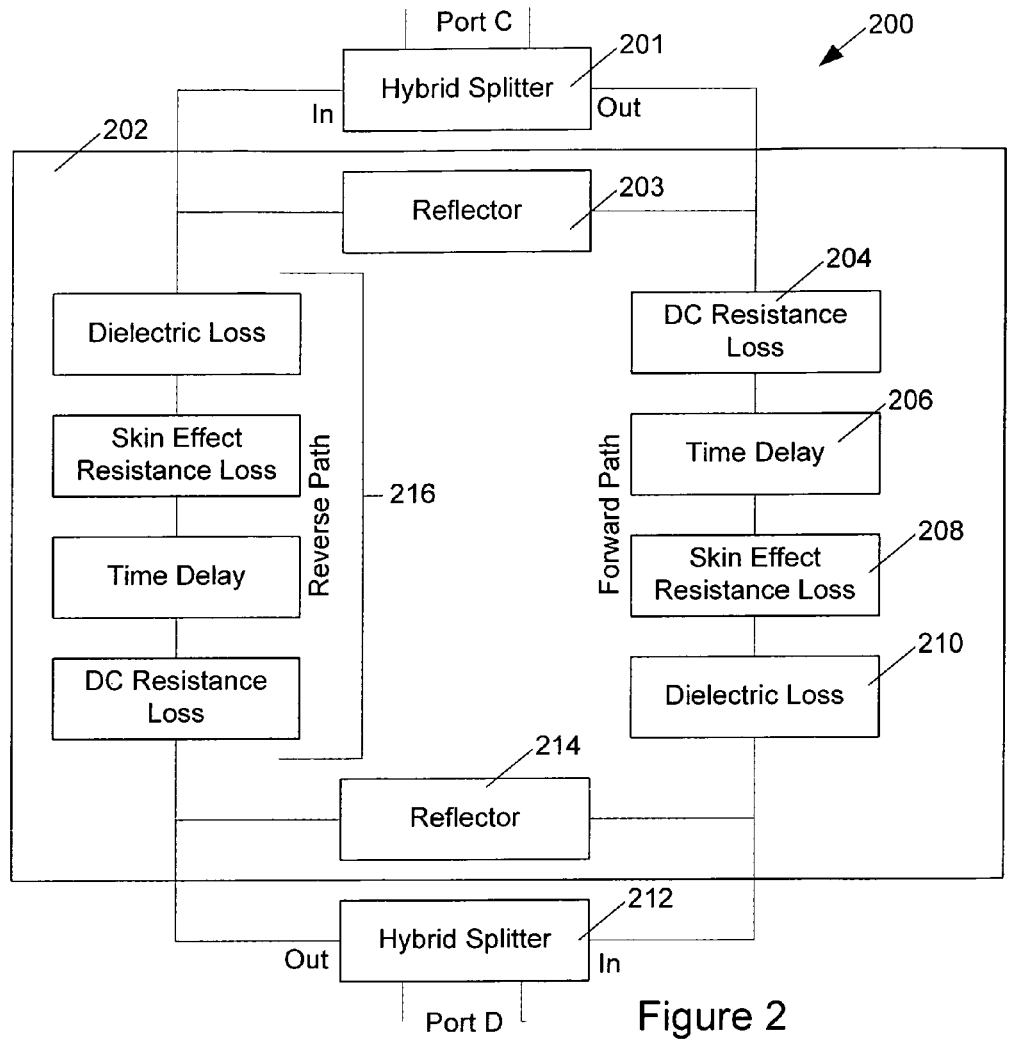
FIG. 2 is a block diagram of a model of balanced transmission line having separate paths in forward and reverse directions.

A transmission line model 200 having separate forward and reverse conduction paths is illustrated in FIG. 2. Each port of the transmission line model, such as input Port C, couples to a bidirectional port of a model of a hybrid, such as hybrid 201. Hybrid 201 serves to couple separate forward and reverse signal paths to bidirectional Port C. The forward signal path couples to an output port of modeled hybrid 201, the reverse signal path couples to an input port of hybrid 201. Hybrid 201 couples simulated energy from the reverse path to Port C, and from Port C to the forward path. Both the forward and reverse paths are modeled in subcircuit loss block 202 as illustrated.

A top level subcircuit for the lossy transmission line of FIG. 2 is as follows.

```
.subckt tran_wh in inrtn out outrtn P_Lo=0 P_Co=0 P_Ro=0
P_Go=0
P_Rs=0 P_Gd=0 P_len=0
* Terminals:
* in          Port 1 signal
* inrtn       Port 1 return
* out         Port 2 signal
* outrtn      Port 2 return
* Returns are isolated from node 0 and each other
* Parameters:
* Lo = Inductance Henrys/unit length
* Co = Capacitance Farads/unit length
* Ro = DC resistance Ohms/unit length
* Go = DC parallel conductance Siemens/unit length
* Rs = Skin effect resistance Ohms/sqrt(Hertz)/unit length
* Gd = Dielectric conductance Siemens/Hertz/unit length
* len = Length of trans line (same length unit as above!!)
.param Td='sqrt(P_Lo*P_Co)*P_len'
* Time delay of trans line
.param Zo='sqrt(P_Lo/P_Co)'
* Characteristic impedance of trans line
.param kdc='P_Ro/2/Zo*P_len+1e-12'
* ONE HALF DC resistance of trans line normalized to Zo
.param cdc='1/2/kdc*(P_Rs/(P_Ro+1e-12))**2'
.param tand='P_Gd/6.283/P_Co'
* Loss tangent of dielectric
.param Fs='1/(P_Rs*P_len/Zo/2+1e-12)**2'
* Characteristic frequency of skin effect loss
.param Fd='1/(3.142*tand*P_len*sqrt(P_Lo*P_Co)+1e-20)'
* Characteristic frequency of dielectric loss
Xhy1 in inrtn 10 21 hybrid P_Zhy='Zo'       $ Hybrid splitter
Xloss1 10 11 20 21 loss P_kdc='kdc' P_cdc='cdc' P_Td='Td'
P_Fs='Fs'
P_Fd='Fd'
* Loss circuit two way includes scattering parameters
* S21 S12
Xhy2 out outrtn 20 11 hybrid P_Zhy='Zo'     $ Hybrid splitter
.ends tran_wh
```

Example Spice code for each hybrid 201, 212 is as follows, where P_Zhy is a characteristic impedance of the transmission line:

```
.subckt hybrid 1 2 5 6 P_Zhy=0
*(terms 1 & 2) to forward (5,0) and reverse (6,0) signal paths
  * 1 = line + (single mode only)
  * 2 = line − (isolated from ground)
  * 5 = fwd/rev out
  * 6 = rev/fwd in
V1 1 3 0
V2 3 4 0
Rterm1 4 2 'P_Zhy'
G1 2 3 6 0 '2/P_Zhy'
H1 5 0 poly(2) V1 V2 0 'P_Zhy/2' 'P_Zhy/2'
.ends hybrid
```

The forward path models energy transfer, including time delay and loss, from port C to port D, while the reverse path models energy transfer, including time delay and loss, from port D to port C. The reverse path is coupled to the forward path with reflector model 203. Reflector 203 allows a portion of signals on the reverse path to be reflected onto the forward path, while Reflector 214 allows a portion of signals on the forward path to be reflected onto the reverse path. Reflectors 203, 214, include a model of the impedance increase resulting from the series resistance of the transmission line. This reflection is helps to correctly model the DC resistance of the line. Example Spice code for the reflector model 203 is as follows, where the characteristic impedance of the transmission line within the loss subcircuit is set as one ohm; reflector 214 is similar.

In the example code, subcircuit "loss" models both forward and reverse paths

```
.subckt loss 11 16 21 26 P_kdc=0 P_cdc=0 P_Td=0 P_Fs=0 P_Fd=0
* 11 = line_1 forward in
* 16 = line_1 forward out
* 21 = line_2 reverse in
* 26 = line_2 reverse out
R1 11 17 1
R2 17 0 'P_kdc'         $P_kdc parameter determines the amount of
reflection.
C2 17 0 'P_Td/P_kdc'
E1 26 25 17 0 1.0       $coupling of reverse path into forward path
```

The forward path continues with a DC resistance loss model 204 of the transmission line. Example Spice code for the DC resistance model is as follows, where the characteristic impedance of the attenuation circuit is 1 ohm:

```
R3 11 12 'P_kdc'        $S21 DC loss term
C3 11 12 'P_cdc'
```

Skin resistance replaces the DC resistance at a frequency where the two are of equal magnitude, so the capacitor C3 effectively removes DC resistance R3 from the model at the proper frequency.

Next is an ideal transmission line modeling transmission line delay 206.

```
T1 12 0 13 0 Z0=1 TD='P_Td'
R4 13 0 1               $S21 delay term
```

Next are models for skin loss 208 and dielectric loss 210.

```
Xs1 13 14 attn_skin P_Fs='P_Fs'    $S21 skin loss term
Xd1 14 15 attn_diel P_Fd='P_Fd'    $S21 dielectric loss term
E2 16 15 27 0 1.0                  $S22 buffer output of lossy line
```

The reverse path 216 is similar to the forward path:

```
R5 21 27 1
R6 27 0 'P_kdc'         $S22 reflection term couples to E2
C6 27 0 'P_Td/P_kdc'
R7 21 22 'P_kdc'        $S12 DC loss term
C7 21 22 'P_cdc'
T2 22 0 23 0 Z0=1 TD='P_Td'
R8 23 0 1               $S12 delay term
Xs2 23 24 attn_skin P_Fs='P_Fs'    $S12 skin loss term
Xd2 24 25 attn_diel P_Fd='P_Fd'    $S12 dielectric loss term
.ends loss
```

Figure 3:
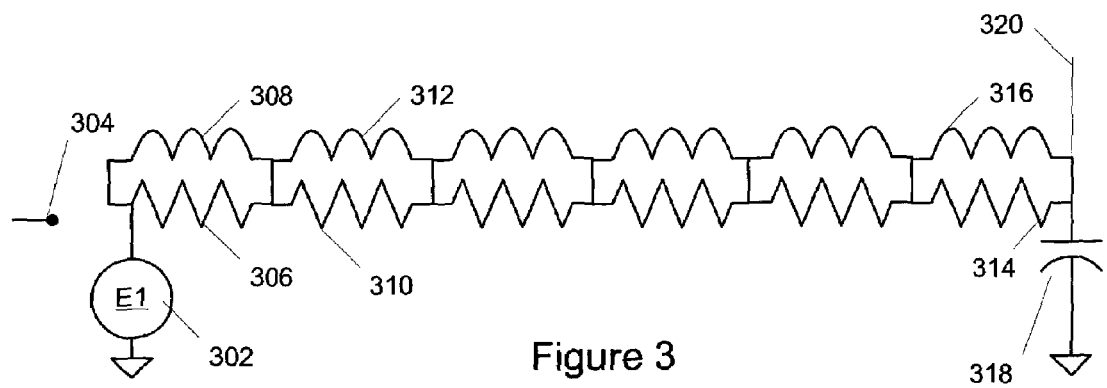
FIG. 3 is a schematic diagram of a model of frequency-dependent dielectric loss.

Frequency-dependent skin effect resistance loss 208 is modeled with the following model, illustrated in more detail in FIG. 3:

```
*Fs is frequency at which transmission is exp(-1)=.3679
This circuit approximates v(out)/v(in)=exp(-sqrt(f/fs))
.subckt attn_skin 10 9 P_Fs=0
.param frad='6.283*P_Fs'
.param a1=.008
.param a2=.0075
.param a3=.033
.param a4=.105
.param a5=.310
.param a6=1.00
.param a7=1.90
.param a8=130.
.param c1=.145
```

Skin-effect model 208 device E1 302 is a voltage-dependent voltage source, dependent on an input 304 to the skin effect mode, that partially isolates this portion of the transmission line model from other circuitry of the model. It is anticipated that the voltage-dependent voltage source model may be substituted with a voltage-sensing resistor and a current-dependent voltage source model. Partial isolation simplifies the modeling and makes it easier to calculate model parameters. The model has several sets of resistor-inductor pairs, such as R1 306 and L1 308, R2 310 and L2 312, and R6 314 and L6 316 that combine to provide a series impedance that increases with frequency. The skin-effect model 208 also has at least one capacitor, such as C0 318, that provides a shunt impedance that decreases with frequency. The skin-effect model 208 output 320 therefore has a frequency-dependent characteristic. It is anticipated that the number of resistor-inductor pairs may vary from the six pairs illustrated, greater accuracy can be achieved at a cost in simulation time if eight pairs are used, while four pairs may suffice for some simulations; a pair count between four and eight will suffice for most simulation purposes.

```
E1 1 0 10 0 1.000
R1 1 2 'a1'
L1 1 2 'a1*100000/frad'
R2 2 3 'a2'
L2 2 3 'a2*10000/frad'
R3 3 4 'a3'
L3 3 4 'a3*1000/frad'
R4 4 5 'a4'
L4 4 5 'a4*100/frad'
R5 5 6 'a5'
L5 5 6 'a5*10/frad'
R6 6 7 'a6'
L6 6 7 'a6/frad'
R7 7 8 'a7'
L7 7 8 'a7/10/frad'
R8 8 9 'a8'
L8 8 9 'a8/100/frad'
R0 9 0 1.000
C0 9 0 'c1/frad'
.ends attn_skin
```

Parameters a1 through a8, and c1 are chosen to approximate a mathematical function Vout/Vin=exp(-sqrt(f/Fs)) where f is the frequency variable, and Fs is a scaling parameter that centers the response at a desired frequency. The mathematical function depicts the frequency-dependent loss caused by the skin effect in typical conductors used in electronic circuitry. Once a1–a8 and c1 are chosen, scaling parameter Fs specifies the skin effect loss function for a particular transmission line length and metal conduction characteristics.

Dielectric loss 210 of the transmission line is modeled with the following attenuator model:

```
*Fd is frequency at which transmission is exp(-1)=.3679
*This circuit approximates v(out)/v(in)=exp(-f/fd)
.subckt attn_diel 10 7 P_Fd=0
.param frad='6.283*P_Fd'
.param a1=.018
.param a2=.093
.param a3=.340
.param a4=.760
.param a5=.160
.param c6=.440
.param a6=13.0
.param c7=1.42
E1 1 0 10 0 1.000
R1 1 2 'a1'
L1 1 2 'a1*100/frad'
R2 2 3 'a2'
L2 2 3 'a2*10/frad'
R3 3 4 'a3'
L3 3 4 'a3*3.162/frad'
R4 4 5 'a4'
L4 4 5 'a4/frad'
```

```
R5 5 6 'a5'
L5 5 6 'a5/3.162/frad'
C6 6 0 'c6/frad'
R6 6 7 'a6'
L6 6 7 'a6/10/frad'
R0 7 0 1.000
C7 7 0 'c7/frad'
.ends attn_diel
```

Dielectric loss parameters a1 through a6, c6 and c7 are chosen to approximate a mathematical function Vout/Vin=exp(−f/Fd) where f is the frequency variable, and Fd is a scaling parameter that centers the response at a desired frequency. The mathematical function depicts the frequency-dependent loss for typical dielectrics used in electronic circuitry. Once a1–a6, c6 and c7 are chosen, scaling parameter Fd is sufficient to specify the dielectric loss function for any line length or dielectric loss characteristic.

It is anticipated that the order of model elements in the forward and reverse conduction paths may vary from that illustrated. For example, it is expected that Dielectric Loss module 210 may be swapped in the forward path with Skin Effect Resistance Loss module 208 with no noticeable change in model performance.

The forward path couples to an In port of the transmission line's modeled output hybrid 212, the reverse path couples to the modeled hybrid's Out port.

In a particular embodiment, the present transmission line model is provided as a subcircuit. The subcircuit is instantiated in a user's circuitry model wherever a transmission line is required in the simulated circuit. The model is typically invoked with the following parameters:

| | |
|---|---|
| P_Lo | A characteristic inductance of the line, |
| P_Co | A characteristic capacitance of the line, |
| P_len | A length of the line, |
| P_Ro | A DC resistance of the line |
| P_Go | A DC leakage conductance line-line. |
| P_Rs | A skin-effect loss resistance of the line, |
| P_Gd | A dielectric loss parameter, |

P_$L_o$ is the inductance per meter of the transmission line structure. The inductance and other parameters are distributed through the length of the line, and the actual response of the line is determined from the solution of the telegrapher's equation.

P_$C_o$ is the capacitance per meter. In the two line model, P_$C_o$ must be the sum of the line to ground capacitance and mutual capacitance between the lines ($C_m$). The two line model is assumed to be symmetric, so $C_{o1}=C_{o2}$.

P_$R_o$ is the series resistance per meter at DC. This is specified as the resistance of the center conductor, since for practical DC cases, ground return resistance is small. This resistance increases slightly at frequencies in the hundred KHz range, because the ground return currents are forced by the EM fields to gather in the nearest vicinity of the signal within the ground return structure P_$R_s$ is the skin effect parameter. At higher frequencies in the tens of MHz range, the widely known skin effect causes currents in the conductors to move away toward the surface of the metal. This causes the effective series resistance of the conductors to increase proportional to the square root of frequency: $R_{effective}=R_s*sqrt(freq)$. In this case, the return path resistance is very important, because the EM fields are determining the pattern of the ground return currents. The single line model P_$R_s$ includes the ground return resistance in the P_$R_s$ parameter. The units for P_$R_s$ are ohms/sqrt(Hz)/meter.

P_$G_o$ is the DC component of the leakage conductance from line to ground. Because low leakage insulators are used in computer systems, this parameter is ignored.

P_$G_d$ is the dielectric loss parameter. Although insulators have a nearly infinite DC resistance, their polarization properties are not perfect. All dielectrics will exhibit an energy loss on polarization akin to hysteresis loss. Each polarization reversal causes a fixed loss of energy, so that there is a power loss under AC excitation that is proportional to the frequency. This is a material property, so different materials will exhibit different losses. The P_$G_d$ parameter models the dielectric loss as a conductance from signal to ground: $G_{effective}=$ P_$G_d$*freq. The units of P_$G_d$ are Siemens/Hz/meter, or for old timers, Mhos/Hz/meter.

P_Len is the length of the transmission line in meters.

Figure 4:
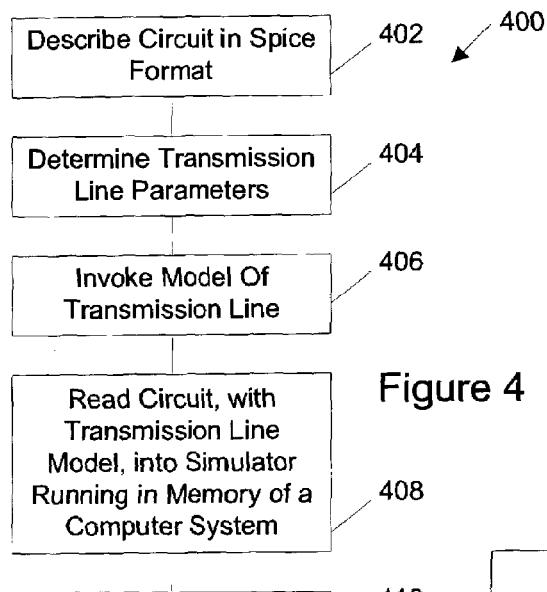
FIG. 4 is a flowchart of a method for simulation with the model herein described.
Figure 5:
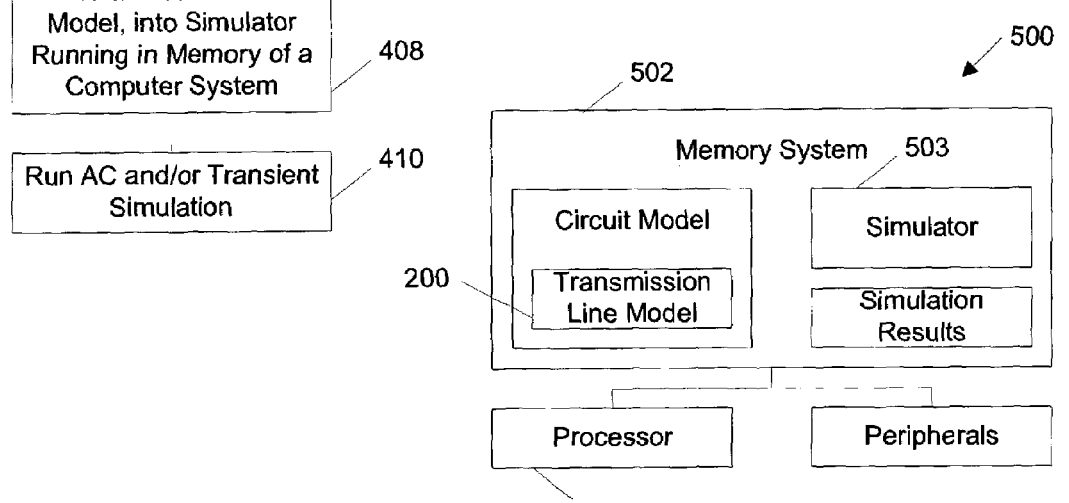
FIG. 5 is a block diagram of a computer system for simulating with the model herein described.

FIG. 4 illustrates a method 400 of simulating circuits with the herein described transmission line model. A user models 402 the circuit in a format suitable for a Spice, Spice-like, or Spice-derived circuit simulator. The circuit is a circuit for which the user needs a transmission line model. The user then determines appropriate parameters 404 for the transmission line model. These parameters may be calculated based on measurements of a transmission line, or extracted from a table having parameters for typical transmission lines whether they be stripline, twisted pair, coaxial cable, or integrated circuit internal interconnect. The user invokes 406 the model with the determined parameters in simulation source. The simulation source, with circuit model and transmission line model, is then read 408 into a memory system 502 of a simulation system 500 such as the circuit simulation system illustrated in FIG. 5, and the simulation is run 410 by simulator code 503 running on a processor 504 of the simulation system 500.

A computer program product is any machine-readable media, such as an EPROM, ROM, RAM, DRAM, disk memory, or tape, having recorded on it computer readable code that, when read by and executed on a computer, instructs that computer to perform a particular function or sequence of functions. The computer readable code of a program product may be a program, such as a Spice-like simulator, or a computer model readable and executable by a program. A computer system having memory, the memory containing the heretofore described circuit model, such that the model may be read by a processor of the computer and induce a simulator running on the processor to simulate a transmission line, is a computer program product.

While the forgoing has been particularly shown and described with reference to particular embodiments thereof, it will be understood by those skilled in the art that various other changes in the form and details may be made without departing from the spirit and hereof. It is to be understood that various changes may be made in adapting the description to different embodiments without departing from the broader concepts disclosed herein and comprehended by the claims that follow.

What is claimed is:
1. A circuit simulation system comprising:
a processor coupled to a memory, the memory comprising at least:

simulator code comprising machine readable instructions executable by the processor;

a circuit model configured as input for the simulator code, the circuit model comprising a transmission line model;

wherein the transmission line model comprises:

a first and a second hybrid model, each hybrid model having a bidirectional port, an input port, and an output port;

a forward path model, the forward path model coupled to the output port of the first hybrid model and to the input port of the second hybrid model;

a reverse path model, the reverse path model coupled to the output port of the second hybrid model and to the input port of the first hybrid model;

a first reflection model coupling from the reverse path model to the forward path model; and a second reflection model coupling from the forward path model to the reverse path model;

wherein the processor is configured to execute the machine readable instructions of the simulator code to generate simulation results for a user, and store the simulation results in the memory.

2. The simulation system of claim 1, wherein the forward path model further comprises at least a frequency dependent loss model and a delay model, and the reverse path model further comprises at least a frequency dependent loss model and a delay model.

3. The simulation system of claim 2, wherein the delay model of the forward path model comprises an ideal transmission line model.

4. The simulation system of claim 2, wherein the frequency dependent loss model of the forward path model further comprises a resistive model and a skin-effect loss model.

5. The simulation system of claim 2, wherein the frequency dependent loss model of the forward path model further comprises a dielectric loss model.

6. The simulation system of claim 2, wherein the frequency dependent loss model of the reverse path model further comprises a resistive loss model and a skin-effect loss model.

7. The simulation system of claim 6 wherein the skin-effect loss model further comprises:

a dependent voltage source model selected from the group consisting of a current-dependent voltage source model and a voltage-dependent voltage source model;

a plurality of paired resistor models and inductor models, the paired models being coupled in series, where a first pair of the plurality of paired models is driven by the voltage source model, where within each pair the resistor and inductor models are connected in parallel; and a capacitor model driven by a last pair of the plurality of paired models.

8. The simulation system of claim 7, wherein the skin-effect loss model is passed a first parameter P_Fs, the parameter P_Fs scaling a value of inductance of a plurality of the paired resistor and inductor models; and wherein the skin-effect loss model has a response Vout/Vin approximating $\exp(-\sqrt{f/P\_Fs})$.

9. The simulation system of claim 7, wherein the loss model of the forward path model further comprises a dielectric loss model.

10. The simulation system of claim 6 wherein the dielectric loss model further comprises:

a dependent voltage source model selected from the group consisting of a current-dependent voltage source model and a voltage-dependent voltage source model;

a plurality of paired resistor models and inductor models, the paired models being coupled in series, where a first pair of the plurality of paired models is driven by the voltage source model, where within each pair the resistor and inductor models are connected in parallel; and a capacitor model driven by a last pair of the plurality of paired models;

wherein the resistive loss model is passed a first parameter P_Ed, the parameter P_Fd scaling a value of inductance of a plurality of the paired resistor and inductor models; and wherein the dielectric-effect loss model has a frequency-dependent response Vout/Vin approximating $\exp(-\sqrt{f/P\_Fd})$.

11. A computer program product comprising machine readable media having recorded thereon:

a computer simulation model of a transmission line;

and simulator code which, when executed, utilizes the computer simulation model to produce simulation results for a user and store the simulation results in memory;

wherein the computer simulation model comprises:

a first and a second hybrid model, each hybrid model having a bidirectional port, an input port, and an output port;

a forward path model, the forward path model coupled to the output port of the first hybrid model and to the input port of the second hybrid model;

a reverse path model, the reverse path model coupled to the output port of the second hybrid model and to the input port of the first hybrid model;

wherein the forward path model comprises a skin-effect loss model further comprising:

a dependent voltage source model selected from the group consisting of a current-dependent voltage source model and a voltage-dependent voltage source model;

a plurality of paired resistor and inductor models, the paired resistor and inductor models being coupled in series, where a first pair of the plurality of paired resistor and inductor models being driven by the voltage source model, where within each pair of the plurality of paired resistor and inductor models the resistor and inductor models are connected in parallel; and a capacitor model driven by a last pair of the plurality of paired resistor and inductor models.

12. The computer program product of claim 11, wherein the skin-effect loss model is passed a first parameter P_Fs the parameter P_Fs scaling a value of inductance of a plurality of the paired resistor and inductor models; and wherein the skin-effect loss model has a response Vout/Vin approximating $\exp(-\sqrt{f/P\_Fs})$.

13. The computer program product of claim 11, wherein there are between four and eight sets of paired resistor and inductor models in the skin-effect loss model.

14. A method of simulating a circuit including a transmission line, comprising the steps of:

modeling the circuit with a circuit model comprising a transmission line model;

reading the circuit model into a circuit simulator; and simulating the circuit to generate simulation results for a user, and storing the simulation results in memory;

wherein the transmission line model comprises:
a first and a second hybrid model, each said hybrid model having a bidirectional port, an input port, and an output port;
a forward path model coupled to the output port of the first hybrid model and to the input port of the second hybrid model;
a reverse path model coupled to the output port of the second hybrid model and to the input port of the first hybrid model;
a first reflection model coupling the reverse path model to the forward path model; and
a second reflection model coupling the forward path model to the reverse path model.

15. The method of claim 14, wherein the forward path model further comprises a frequency dependent loss model and a delay model, and the reverse path model further comprises a frequency dependent loss model and a delay model.

16. The method of claim 15, wherein the frequency dependent loss model of the forward path model further comprises a resistive loss model and a skin-effect loss model.

17. The method of claim 16 wherein the skin-effect loss model further comprises:
a dependent voltage source model selected from the group consisting of a current-dependent voltage source model and a voltage-dependent voltage source model;
a plurality of paired resistor models and inductor models, the paired models being coupled in series, wherein a first pair of the plurality of paired models is driven by the voltage source model, where within each pair the resistor and inductor models are connected in parallel; and
a capacitor model driven by a last pair of the plurality of paired models.

* * * * *

UNITED STATES PATENT AND TRADEMARK OFFICE
CERTIFICATE OF CORRECTION

PATENT NO. : 7,212,960 B2 Page 1 of 1
APPLICATION NO. : 10/365808
DATED : May 1, 2007
INVENTOR(S) : David W. Quint et al.

It is certified that error appears in the above-identified patent and that said Letters Patent is hereby corrected as shown below:

On the title page, in item (57), under "Abstract", in column 2, line 7, delete "mode" and insert -- model --, therefor.

In column 10, line 15, in Claim 10, delete "P_ED," and insert -- P_FD --, therefor.

In column 10, line 53, in Claim 12, after "P_FS" insert -- , --.

In column 10, line 57, in Claim 12, delete "(-sprt(f/P_Fs))" and insert -- (-sqrt(f/P_Fs)) --, therefor.

Signed and Sealed this

Twenty-sixth Day of August, 2008

JON W. DUDAS
*Director of the United States Patent and Trademark Office*